(12) United States Patent
Kakuya et al.

(10) Patent No.: US 11,936,089 B2
(45) Date of Patent: Mar. 19, 2024

(54) TRANSMISSION LINE ASSEMBLY

(71) Applicant: DENSO CORPORATION, Kariya (JP)

(72) Inventors: Yuuji Kakuya, Nisshin (JP); Kazuhiro Aoki, Kariya (JP); Yusuke Tainaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 432 days.

(21) Appl. No.: 17/370,777

(22) Filed: Jul. 8, 2021

(65) Prior Publication Data
US 2021/0336320 A1  Oct. 28, 2021

Related U.S. Application Data

(63) Continuation of application No. PCT/JP2020/000306, filed on Jan. 8, 2020.

(30) Foreign Application Priority Data

Jan. 11, 2019 (JP) .................. 2019-003492

(51) Int. Cl.
*H01P 3/08* (2006.01)
*H05K 1/02* (2006.01)
*H05K 1/11* (2006.01)

(52) U.S. Cl.
CPC ............. *H01P 3/08* (2013.01); *H05K 1/0237* (2013.01); *H05K 1/115* (2013.01)

(58) Field of Classification Search
CPC ... H01P 3/08; H01P 1/047; H01P 5/02; H05K 1/0237; H05K 1/115; H05K 1/0222; H05K 1/0227; H05K 2201/09618; H05K 2201/09809
See application file for complete search history.

(56) References Cited

U.S. PATENT DOCUMENTS

| 2009/0309680 A1 | 12/2009 | Suzuki |
| 2011/0187482 A1 | 8/2011 | Ohno et al. |
| 2011/0241805 A1 | 10/2011 | Suzuki |
| 2020/0028228 A1 | 1/2020 | Yoshioka et al. |

FOREIGN PATENT DOCUMENTS

| JP | 10190317 A | * | 7/1998 |
| JP | 2007-336299 A | | 12/2007 |

* cited by examiner

*Primary Examiner* — Andrea Lindgren Baltzell
*Assistant Examiner* — Kimberly E Glenn
(74) *Attorney, Agent, or Firm* — MASCHOFF BRENNAN

(57) ABSTRACT

A transmission line assembly is configured such that (i) a first target inner layer is one of second to (N−1)-th pattern layers selected therefrom, and (ii) a second target inner layer is another one of the second to (N−1)-th pattern layers selected therefrom; the second to (N−1)-th pattern layers except for the first and second target inner layers are referred to as inner layers. The transmission line assembly includes band-like first and second slits formed through the ground pattern of a corresponding one of the first and second target inner layers to expose a part of one of dielectric layers; the one of the dielectric layers is adjacent to the corresponding one of the first and second target inner layers. Each of the first and second slits has an edge facing the interlayer line, and the edge of each of the first and second slits is concavely curved toward the interlayer line.

7 Claims, 12 Drawing Sheets

TRANSMISSION LINE ASSEMBLY

CROSS-REFERENCE TO RELATED APPLICATION

This application is a bypass continuation application of currently pending international application No. PCT/JP2020/000306 filed on Jan. 8, 2020 designating the United States of America, the entire disclosure of which is incorporated herein by reference.

This application is based on and claims the benefit of priority from Japanese Patent Application No. 2019-003492 filed on Jan. 11, 2019, the disclosure of which is incorporated in its entirety herein by reference.

TECHNICAL FIELD

The present disclosure relates to technologies that transmit a high frequency signal in a layering direction of a multilayer dielectric board.

BACKGROUND

There are waveguides formed in a multilayer dielectric board, which enable high-frequency signals to be transmitted in the layering direction of the multilayer dielectric board.

SUMMARY

A transmission line assembly according to an exemplary aspect is configured such that
(1) A first target inner layer is one of second to (N−1)-th pattern layers selected therefrom
(2) A second target inner layer is another one of the second to (N−1)-th pattern layers selected therefrom, the second to (N−1)-th pattern layers except for the first and second target inner layers being referred to as inner layers The transmission line assembly includes first and second slits. Each of the first and second slits has a band-like shape, and is formed through a ground pattern of a corresponding one of the first and second target inner layers to expose a part of one of dielectric layers; the one of the dielectric layers is adjacent to the corresponding one of the first and second target inner layers. Each of the first and second slits has an edge facing the interlayer line, and the edge of each of the first and second slits is concavely curved toward the interlayer line.

DETAILED DESCRIPTION OF EMBODIMENTS

Figure 1:
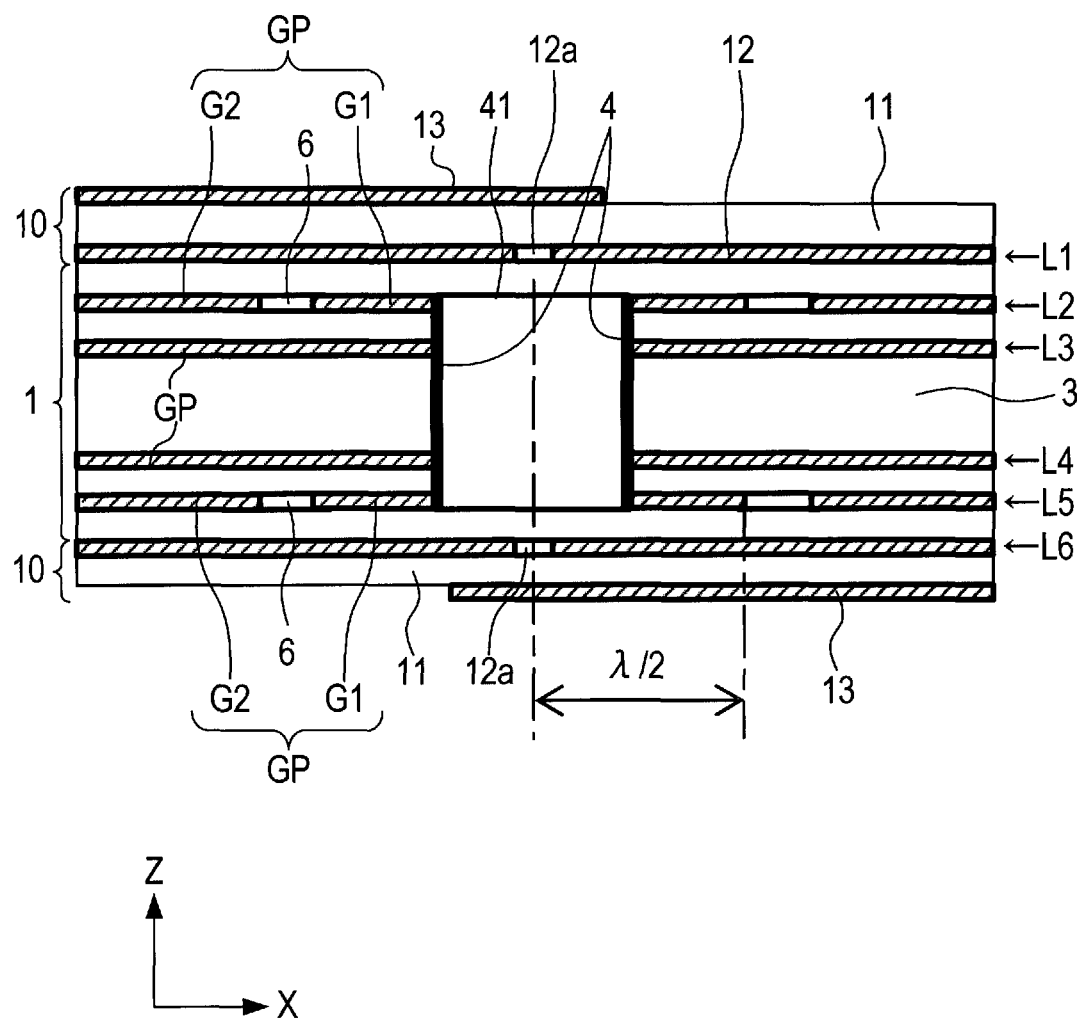
FIG. 1 is a cross sectional view illustrating the configuration of a transmission line assembly according to the first embodiment.

Japan Patent Publication No. 4833026 discloses a first waveguide, which has a rectangular shape in its transverse cross section, formed in a multilayer dielectric board. The first waveguide is configured to enable high frequency signals to be transmitted in the layering direction of the multilayer dielectric board. One of opposite input/output (I/O) ends of the first waveguide is communicably coupled to one of opposite I/O ends of a second waveguide formed in a metallic board. One of the opposite I/O ends of the first waveguide and one of the opposite I/O ends of the second waveguide, which are communicably coupled with each other, will be referred to as coupling I/O ends of the respective first and second waveguides.

In particular, the patent publication discloses a technology that aims to reduce leakage of high frequency signals from the coupling portion between the first waveguide and the second waveguide, that is, from the coupling I/O ends of the respective first and second waveguides.

A land ground pattern is formed on one of major surfaces of the multilayer dielectric board, and is arranged around the first waveguide; the one of the major surfaces of the multilayer dielectric board constituting the coupling portion will be referred to as a dielectric coupling surface. Inner ground patterns are also formed in the multilayer dielectric board. The first waveguide has a pair of E-planes that are perpendicular to the direction of an electric field vector; the direction of the electric field vector will be referred to as an electric field direction.

That is, the first waveguide has, as the pair of E-planes, a pair of longitudinal planes located at both ends of a lateral direction in its transverse cross section.

The patent publication discloses a choke structure constructed based on the land ground pattern formed on the coupling surface. The choke structure works to reduce leakage of high frequency signals from the coupling portion.

Specifically, the choke structure includes linear strip slits each formed in the land ground pattern to expose a corresponding portion of the dielectric coupling surface. In particular, the slits are arranged to be separated from the respective E-planes by approximately $\lambda/4$; $\lambda$ represents an electrical length of each high frequency signal propagated in the first waveguide.

The choke structure includes a plurality of via holes formed through the multilayer dielectric board and arranged on the both sides of each slit. Each via hole electrically connects the land ground pattern and a selected one of the inner ground patterns to each other; the selected one of the inner ground patterns is separated from the dielectric coupling surface by $\lambda/4$.

To sum up, the choke structure disclosed in the patent publication is configured such that the land ground pattern and the via holes constitute choke grooves, each of which has a depth of $\lambda/4$.

The inventors have studied in detail the technology disclosed in the patent publication, and thereafter have found out a problem that the technology disclosed in the patent publication may not sufficiently reduce leakage of high frequency signals propagated in specific directions.

More concretely, for reducing leakage of target high frequency signals whose electric field waves oscillating in the electric field direction of the first waveguide, the technology disclosed in the patent publication is configured such that the choke structure generates counter frequency signals, whose electric field waves oscillating in the electric field direction, having a predetermined phase opposite to the phase of the oscillating electric field waves of the target high frequency signals.

This configuration reduces leakage of the target high frequency signals from the coupling I/O end of the first waveguide.

The technology disclosed in the patent publication may however insufficiently reduce leakage of high frequency signals as an angle of the oscillating direction of the electric field waves of the target high frequency signals with respect to the electric field direction of the first waveguide becomes larger. This is because, the larger the angle of the oscillating direction of the electric field waves of the target high frequency signals with respect to the electric field direction of the first waveguide, the larger the deviation of the phase of the oscillating electric field waves of the counter frequency signals from the opposite phase that is opposite to the phase of the oscillating electric field of the target high frequency signals.

One aspect of the present disclosure seeks to provide a technology applied to a transmission line assembly for transmission of a high frequency signal in a layering direction of a multilayer dielectric board; the technology seeks to reduce leakage of the high frequency signal from I/O ends of the transmission line assembly.

An exemplary aspect of the present disclosure is a transmission line assembly. The transmission line assembly includes a multilayer board and an interlayer line. The multilayer board includes a plurality of dielectric layers, and N pattern layers; N is an integer equal to or greater than 4. Each adjacent pair of the N pattern layers is arranged to sandwich a corresponding one of the dielectric layers. The N pattern layers includes a first pattern layer as a first outer layer, and an N-th pattern layer as a second outer layer. The first and second outer layers constitute respective outermost layers of the N pattern layers. The N pattern layers include second to (N−1)-th pattern layers. Each of the second to (N−1)-th pattern layers is sandwiched by a corresponding adjacent pair of the dielectric layers.

The interlayer line enables a high frequency signal to be transmitted therethrough in a layering direction of the N pattern layers of the multilayer board. The interlayer line has first and second opening ends.

The transmission line assembly includes a first exterior circuit module mounted on the first outer layer, and a second exterior circuit module mounted on the second outer layer. Each of the first and second exterior circuit modules is arranged such that the high frequency signal transmitted through the interlayer line is inputted thereto or outputted therefrom.

The transmission line assembly includes ground patterns mounted on the respective second to (N−1)-th pattern layers. Each of the ground patterns is located to surround the interlayer line. The first opening end of the interlayer line is located in the ground pattern of a first target inner layer, and the second opening end of the interlayer line is located in the ground pattern of a second target inner layer.

The first target inner layer is one of the second to (N−1)-th pattern layers selected therefrom, and the second target inner layer is another one of the second to (N−1)-th pattern layers selected therefrom. The second to (N−1)-th pattern layers except for the first and second target inner layers are referred to as inner layers.

The transmission line assembly includes first and second slits. Each of the first and second slits has a band-like shape, and is formed through the ground pattern of a corresponding one of the first and second target inner layers to expose a part of one of the dielectric layers. The one of the dielectric layers is adjacent to each of the first and second target inner layers. Each of the first and second slits has an edge facing the interlayer line. The edge of each of the first and second slits is concavely curved toward the interlayer line.

An inner part of the ground pattern of each of the first and second target inner layers, which is located to be closer to the interlayer line than the corresponding one of the first and second slits is, serves as an open stub. That is, a high-frequency signal propagated along the inner ground part of the ground pattern of each of the first and second target inner layers is reflected by the outer periphery of the inner ground part as an echo signal. This results in a high frequency signal leaked out of the interlayer line being cancelled out by the echo signal reflected by the outer periphery of the inner part of the ground pattern of each of the first and second target inner layers.

That is, the transmission line assembly of the exemplary aspect is configured to reduce leakage of a high frequency signal through a gap between each of the first and second target inner layers and a dielectric layer located adjacent to the corresponding one of the first and second target inner layers.

Additionally, each of the first and second slits has an edge facing the interlayer line, and the edge of each of the first and second slits is concavely curved toward the interlayer line.

This configuration of each of the first and second slits prevents the minimum distance from the center of the interlayer line to any point on the edge of the corresponding one of the first and second slits from being greatly changed depending on an orientation of the corresponding point from the center of the interlayer line as compared with a conventional configuration that includes straight slits.

This therefore prevents deterioration of the advantageous effect of reducing leakage of a high frequency signal due to difference in phase between the echoes, making it possible to reduce variations in the leakage reduction effects depending on the direction of propagation of the high frequency signals.

Each of the first and second slits is configured not to provide a choke structure, which is different from the above conventional technology, making it possible to more simply manufacture the transmission line assembly of the exemplary aspect.

The following describes embodiments of the present disclosure with reference to the accompanying drawings.

First Embodiment 1-1. Configuration

The following describes a transmission line assembly 1 according to the first embodiment to which the present disclosure is applied with reference to the accompanying drawings.

The transmission line assembly 1, as illustrated in FIG. 1, includes a multilayer dielectric board 3. The multilayer dielectric board 3 includes (N−1) dielectric layers, and N pattern layers $L_1$ to $L_N$. Each adjacent pair of N pattern layers $L_1$ to $L_N$ sandwiches a corresponding one of the (N−1) dielectric layers.

The number N can be set to an integer more than or equal to 4. In FIG. 1, the number N is set to 6, so that the multilayer dielectric board 3 is comprised of the six pattern layers $L_1$ to $L_6$.

The pattern layers $L_1$ and $L_N$, which constitute the outermost layers of the N pattern layers $L_1$ to $L_N$, will be referred to as outer layers, and the remaining layers $L_2$ to $L_{N-1}$ located between the outer layers will be referred to as inner layers.

A PALUP board is for example used as the multilayer dielectric board 3. The multilayer board 3 can be manufactured by
  (1) Preparing a plurality of bases, each of which is made of thermoplastic material and has major surfaces
  (2) Etching one of the major surfaces of each base to thereby print a predetermined wiring pattern on one of the major surfaces of the corresponding base
  (3) Stacking the wiring-pattern etched bases on one another
  (4) Thermally pressing the stacked bases, thus providing a multilayer wiring-pattern board as the multilayer board 3

The multilayer dielectric board 3 includes a waveguide 4 formed thereinside; the waveguide 4 serves as a transmission line, i.e., interlayer line, for transmission of high frequency signals in the layering direction, in other words, the stack direction, of the multilayer dielectric board 3.

The waveguide 4 has a tubular shape with a substantially rectangular shape in its transverse cross section, and is embedded in the inner layer $L_2$ and the inner layer $L_{N-1}$. The waveguide 4 has first and second openings at respective I/O ends thereof, and the first opening is located in the inner layer $L_2$, and the second opening is located in the inner layer $L_{N-1}$.

The following describes an example of a method of how to form the waveguide 4 in the multilayer dielectric board 3. Specifically, the method includes
  1. A step of boring a predetermined portion in the multilayer dielectric board 3
  2. A step of plating the inner periphery of the bored portion with a conductor
  3. A step of filling, into the conductor-covered hollow portion, a dielectric material that is the same as the dielectric material of each dielectric layer of the multilayer dielectric board 3, thus forming the waveguide 4 in the multilayer dielectric board 3

Other methods of forming the waveguide 4 in the multilayer dielectric board 3 can be carried out.

Each of the inner layers $L_2$ to $L_{N-1}$ has a ground pattern GP formed thereon as the corresponding conductor pattern, and the waveguide 4 is connected to the conductor patterns, i.e., the ground patterns, of the respective inner layers $L_2$ to $L_{N-1}$.

The multilayer dielectric board 3 according to the first embodiment has
  1. The layering direction thereof, which is defined as a Z-axis direction
  2. A lateral direction of the substantially rectangular shape of the transverse cross section of the waveguide 4, which is defined as an X-axis direction
  3. A longitudinal direction of the substantially rectangular shape of the transverse cross section of the waveguide 4, which is defined as a Y-axis direction 1-1-1. Outer Layer An exterior circuit module 10 is mounted on each of the outer layers $L_1$ and $L_N$. Each of the exterior circuit modules 10 serves as a circuit for transmitting and/or receiving high frequency signals through the waveguide 4. Each of the exterior circuit modules 10 includes a dielectric board 11 that has opposing major surfaces, and also has conductive patterns formed on the respective major surfaces.

One of the opposing major surfaces of the dielectric board 11 of the exterior circuit module 10 mounted on the outer layer $L_1$, which is adjacent to the outer layer $L_1$, will be referred to as a first major surface of the dielectric board 11 of the exterior circuit module 10 mounted on the outer layer $L_1$. The other of the opposing major surfaces of the dielectric board 11 of the exterior circuit module 10 mounted on the outer layer $L_1$ will be referred to as a second major surface of the dielectric board 11 of the exterior circuit module 10 mounted on the outer layer $L_1$.

Similarly, one of the opposing major surfaces of the dielectric board 11 of the exterior circuit module 10 mounted on the outer layer $L_N$, which is adjacent to the outer layer $L_N$, will be referred to as a first major surface of the dielectric board 11 of the exterior circuit module 10 mounted on the outer layer $L_N$. The other of the opposing major surfaces of the dielectric board 11 of the exterior circuit module 10 mounted on the outer layer $L_N$ will be referred to as a second major surface of the dielectric board 11 of the exterior circuit module 10 mounted on the outer layer $L_N$.

The first major surface of the dielectric board 11 is wholly covered with a ground pattern 12. The first opening, to which reference numeral 41 is assigned, of the hollow portion of the waveguide 4 has an aperture plane along an X-Y plane defined by the X- and Y-axis directions, and the aperture plane of the first opening 41 of the waveguide 4 has a center portion. The ground pattern 12 has a slit 12a formed therethrough; the slot 12a is disposed to face the center portion of the aperture plane of the first opening 41 of the waveguide 4.

The second major surface of the dielectric board 11 is at least partly covered with a microstrip line 13. The microstrip line 13 has an end, and the end of the microstrip line 13 is disposed to face the slit 12a of the ground pattern 12. That is, the slit 12a serves as a slit antenna using the microstrip line 13 as a feeder.

The exterior circuit modules 10 are constructed separately from the transmission line assembly 1, and the exterior circuit modules 10 are assembled to the transmission line assembly 1 with, for example, adhesives. The material of the dielectric board 11 can be different from the material of the multilayer dielectric board 3 or can be identical to the material of the multilayer dielectric board 3.

The transmission line assembly 1 and the exterior circuit modules 10 can be originally integrated with each other as a single multilayer assembly based on (N+2) layers.

One of the exterior circuit modules 10 will be referred to as a first exterior circuit module 10, and the other thereof will be referred to as a second exterior circuit module 10.

A plurality of antenna elements can be mounted on the second major surface of the dielectric board 11 of the first exterior circuit module 10; the antennal elements are energized based on electrical power supplied from, for example, the microstrip line 13. A transceiver circuit can also be mounted on the second major surface of the dielectric board 11 of the second exterior circuit module 10; the transceiver circuit is configured to perform various tasks based on signals transmitted from or received by the antenna elements through the microstrip line 13.

That is, a transmission signal outputted from the transceiver circuit provided to the first exterior circuit module 10 is supplied to each of the antenna elements provided to the second exterior circuit module 10 through the waveguide 4. Received signals outputted from the respective antenna elements provided to the second exterior circuit module 10 are supplied to the transceiver circuit provided to the first exterior circuit module 10 through the waveguide 4.

1-1-2. Inner Layer

Each of the inner layers $L_2$ to $L_{N-1}$ has the ground pattern GP formed thereon. The ground pattern GP of each of the inner layers $L_2$ to $L_{N-1}$ is disposed to surround a corresponding portion of the outer periphery of the waveguide 4.

Figure 2:
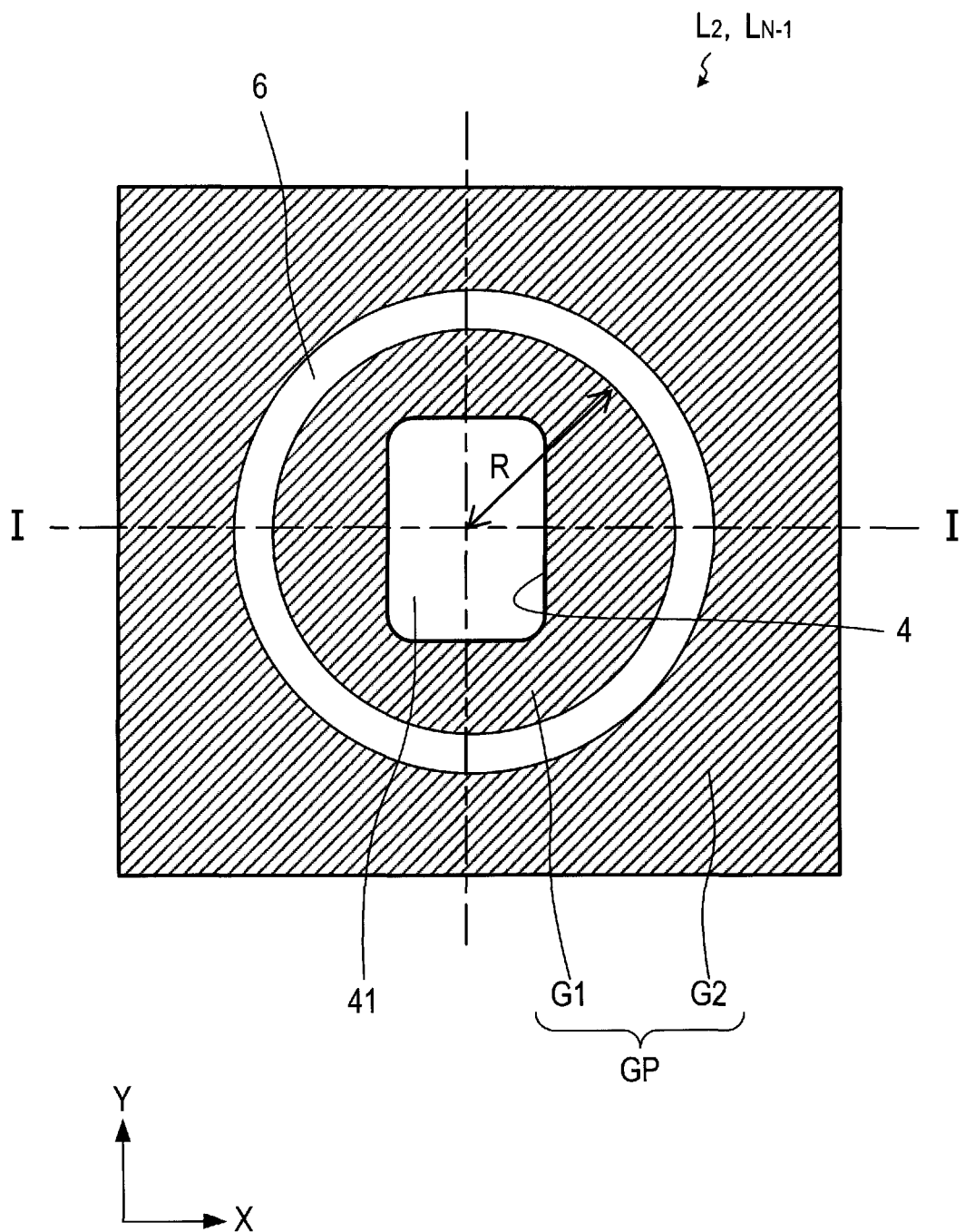
FIG. 2 is a pattern diagram illustrating the configuration of an interlayer line according to the first embodiment.

In particular, the ground pattern GP of each of the inner layers $L_2$ and $L_{N-1}$, which are located at the respective I/O ends of the waveguide 4 has, as illustrated in FIG. 2, a ring-shaped slit 6 formed therethrough; the slit 6 is arranged to extend around the complete periphery of the waveguide 4 to thereby surround the waveguide 4. In other words, the slit 6 is defined to have two concentric inner and outer edges around the center of the waveguide 4. The center of the waveguide 4 corresponds to the center of the transmission line assembly 1.

The arrangement of the waveguide 4 results in the dielectric layers between the ground patterns GP of all the inner layers $L_2$ to $L_{N-1}$ being exposed through the waveguide 4. Additionally, the slit 6 of the ground pattern GP of each of the inner layers $L_2$ and $L_{N-1}$ results in the dielectric layers adjacent to the ground pattern GP of the corresponding one of the inner layers $L_2$ and $L_{N-1}$ being exposed through the slit 6.

The slit 6 causes the ground pattern GP of each of the inner layers $L_2$ and $L_{N-1}$ to be separated into an inner ground pattern G1 and an outer ground pattern G2. The inner ground pattern G1 is disposed between the waveguide 4 and the slit 6, and the outer ground pattern G2 is located across the slit 6 from the inner ground pattern G1.

The inner circular edge of the slit 6 of each of the inner layers $L_2$ and $L_{N-1}$, which defines the outer periphery of the inner ground pattern G1, has a predetermined radius R, and the predetermined radius R of the inner circular edge of the slit 6 is set to $\lambda/2$ where $\lambda$ represents a wavelength, i.e., an electrical length, of high frequency signals propagatable through the waveguide 4. The radius R will be referred to as an inner radius R.

The slit 6 of each of the inner layers $L_2$ and $L_{N-1}$ has a radial width, and the outer circular edge of the slit 6, which defines the inner periphery of the outer ground pattern G2, has a predetermined outer radius. At least one of the radial width of the slit 6 and the outer radius of the outer ground pattern G2 is experimentally determined such that high frequency signals propagated from the center of the waveguide 4 through the inner ground pattern G1 are efficiently reflected by the outer periphery of the inner ground pattern G1.

1-2. Advantageous Effects

The first embodiment described in detail above achieves the following advantageous effects.

The inner ground G1 of the transmission line assembly 1 serves as an open stub that has an open end located at a minimum distance of $\lambda/2$ from the center of the waveguide 4.

Figure 3:
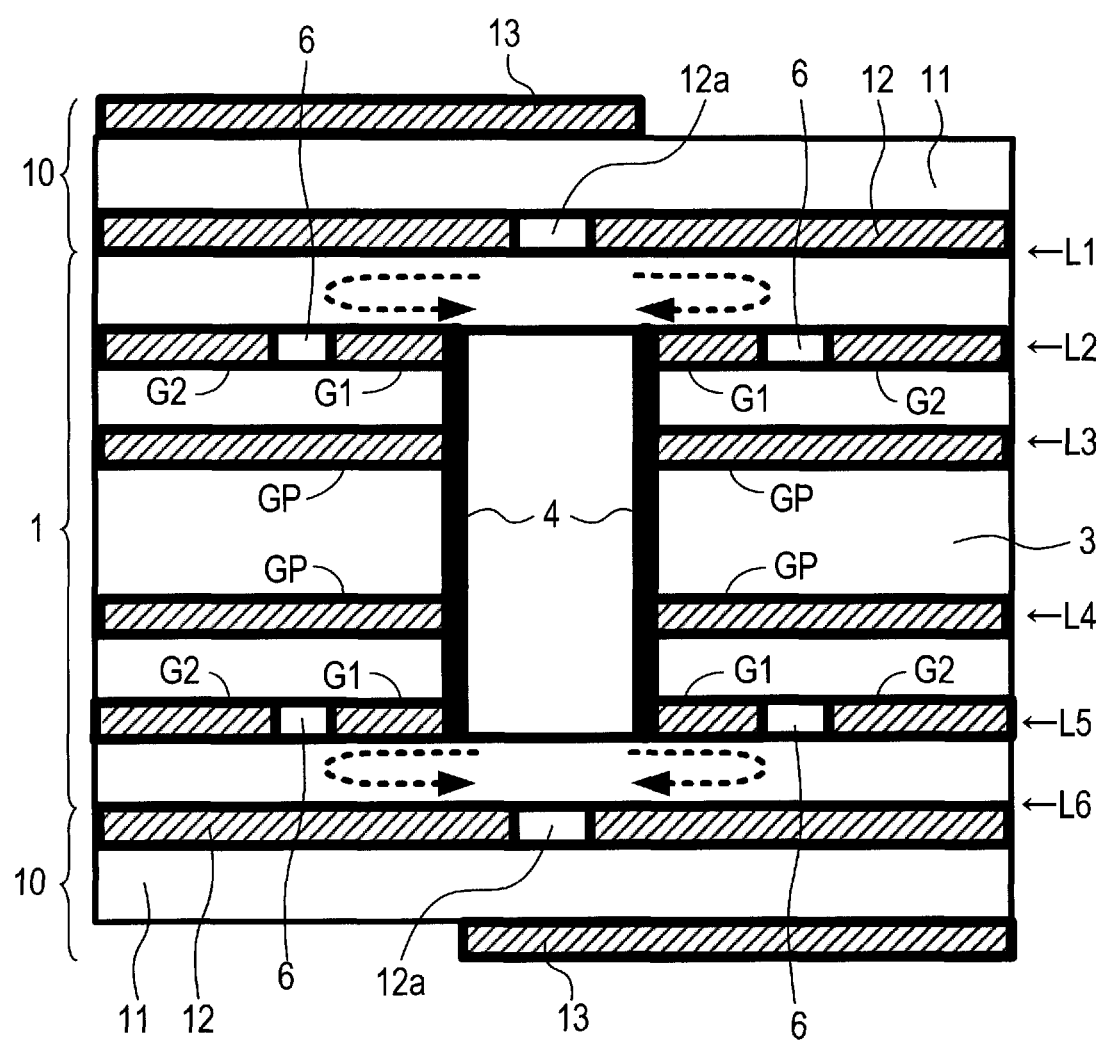
FIG. 3 is a cross sectional view illustrating how slits work.

More specifically, as illustrated in FIG. 3, high-frequency signals propagated along the inner ground pattern G1 through the dielectric layer between the outer layer $L_1$ and the inner layer $L_2$, i.e., between first pair of specific layers, are reflected by the outer periphery of the inner ground patter G1 as first echo signals; the outer periphery of the inner ground patter G1 constitutes a boundary with the slit 6. This results in high frequency signals leaked out of the waveguide 4 being cancelled out by the first echo signals reflected by the outer periphery of the inner ground patter G1.

Similarly, as illustrated in FIG. 3, high frequency signals propagated along the inner ground pattern G1 through the dielectric layer between the outer layer $L_{N-1}$ and the inner layer $L_N$, i.e., between second pair of specific layers, are reflected by the outer periphery of the inner ground patter G1 as second echo signals; the outer periphery of the inner ground patter G1 constitutes the boundary with the slit 6. This results in high frequency signals leaked out of the waveguide 4 being cancelled out by the second echo signals reflected by the outer periphery of the inner ground patter G1.

That is, the transmission line assembly 1 is configured to reduce leakage of high frequency signals through the dielectric layer between each of the first and second pair of specific layers.

Figure 4:
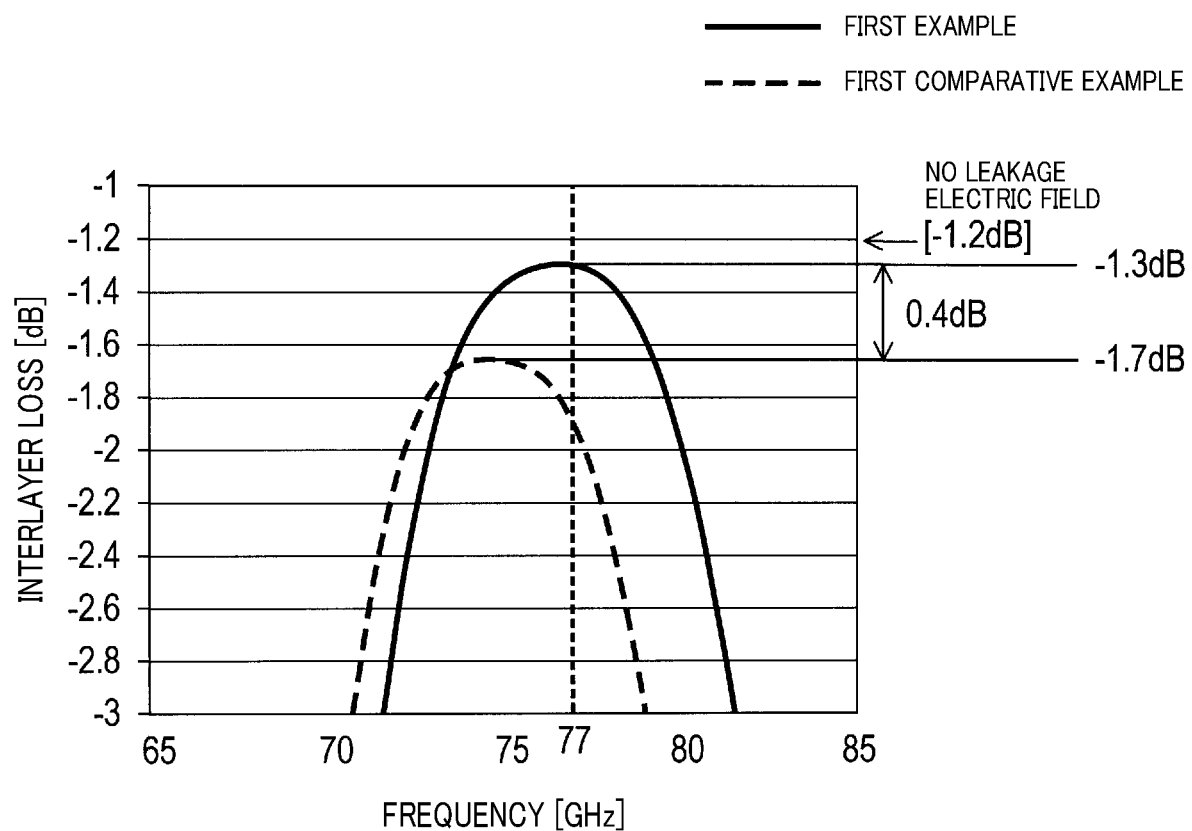
FIG. 4 is a graph illustrating (i) a first result of a transmission loss curve of the interlayer line calculated by a simulation according to a first example with curved slits and (ii) a second result of a transmission loss curve of the interlayer line calculated by a simulation according to a first comparative example with straight slits.

FIG. 4 illustrates (1) A first result of a transmission loss curve calculated by a simulation when high frequency signals are transmitted through the waveguide 4 between the first and second exterior circuits 10 mounted to the respective outer layers $L_1$ and $L_N$ of a transmission line assembly of a first example (2) A second result of a transmission loss curve calculated by a simulation when high frequency signals are transmitted through the waveguide 4 between the first and second exterior circuits 10 mounted to the respective outer layers $L_1$ and $L_N$ of a transmission line assembly of a first comparative example The transmission line assembly of the first example corresponds to the transmission line assembly 1 of the first embodiment including the annular slits 6 whereas the transmission line assembly of the first comparative example includes straight slits 6.

FIG. 4 demonstrates that a value of the transmission loss curve at a most efficient frequency of the first comparative example is −1.7 dB, and a value of the transmission loss curve at a most efficient frequency of the first example is −1.3 dB. That is, the level of the transmission loss at the most efficient frequency of the first example is improved by about 0.4 dB compared to the level of the transmission loss at the most efficient frequency of the first comparative example.

Additionally, a decrease of a peak of the transmission loss curve of the transmission line assembly 1 of the first example from an ideal peak (−1.2 dB) of the transmission line assembly 1 of the first example when leakage of electric field waves out of the waveguide 4 is null becomes a smaller value of 0.1 dB. This makes clear that the transmission line assembly 1 of the first example has a sufficiently smaller level of the transmission loss.

Each of the slits 6 of the transmission line assembly 1 of the first embodiment has a ring shape about the center of the waveguide 4. This configuration enables the inner ground patter G1 to serve as a stub having a length of λ/2 along any direction from the center of the waveguide 4 thereto. This configuration therefore enables high frequency signals propagated along the inner ground pattern G1 in any direction from the center of the waveguide 4 to reach a corresponding portion of the outer periphery of the inner ground pattern in the same phase. This therefore makes it possible to reduce leakage of high frequency signals independently of the propagation direction of the high frequency signals.

The transmission line assembly 1 of the first embodiment has the above configuration that is clearly distinguished from a typical choke structure. This therefore eliminates the need of forming via holes around each slit 6, and the need of setting the width of each adjacent pair of the inner layers to λ/4, making it possible to manufacture the transmission line assembly 1 of the first embodiment more simply.

Second Embodiment 2-1. Different Points of Second Embodiment from First Embodiment A basic structure of a transmission line assembly of the second embodiment is identical to that of the transmission line assembly 1 of the first embodiment. The following therefore mainly describes the different points between the transmission line assembly of the second embodiment and the transmission line assembly 1 of the first embodiment. Reference characters assigned to respective elements in the first embodiment can be commonly assigned to respective elements in the second embodiment as long as each of the elements in the second embodiment has the same structure as the corresponding one of the elements in the first embodiment.

When describing each element in the second embodiment, which has the same structure as the corresponding element in the first embodiment, the following refers to the description of the corresponding element in the first embodiment.

The ground pattern GP of each of the inner layers $L_2$ and $L_{N-1}$ of the first embodiment, which are located at the respective I/O ends of the waveguide 4 has, as illustrated in FIG. 2, the ring-shaped slit 6 formed therethrough; the slit 6 of each of the inner layers $L_2$ and $L_{N-1}$ is arranged to extend around the complete periphery of the waveguide 4 to thereby surround the waveguide 4.

In contrast, the ground pattern GP of each of the inner layers $L_2$ and $L_{N-1}$ of the second embodiment has two ring-shaped slits 16 formed therethrough; each of the slits 16 is arranged to extend a predetermined angular range around the center of the waveguide 4.

Figure 5:
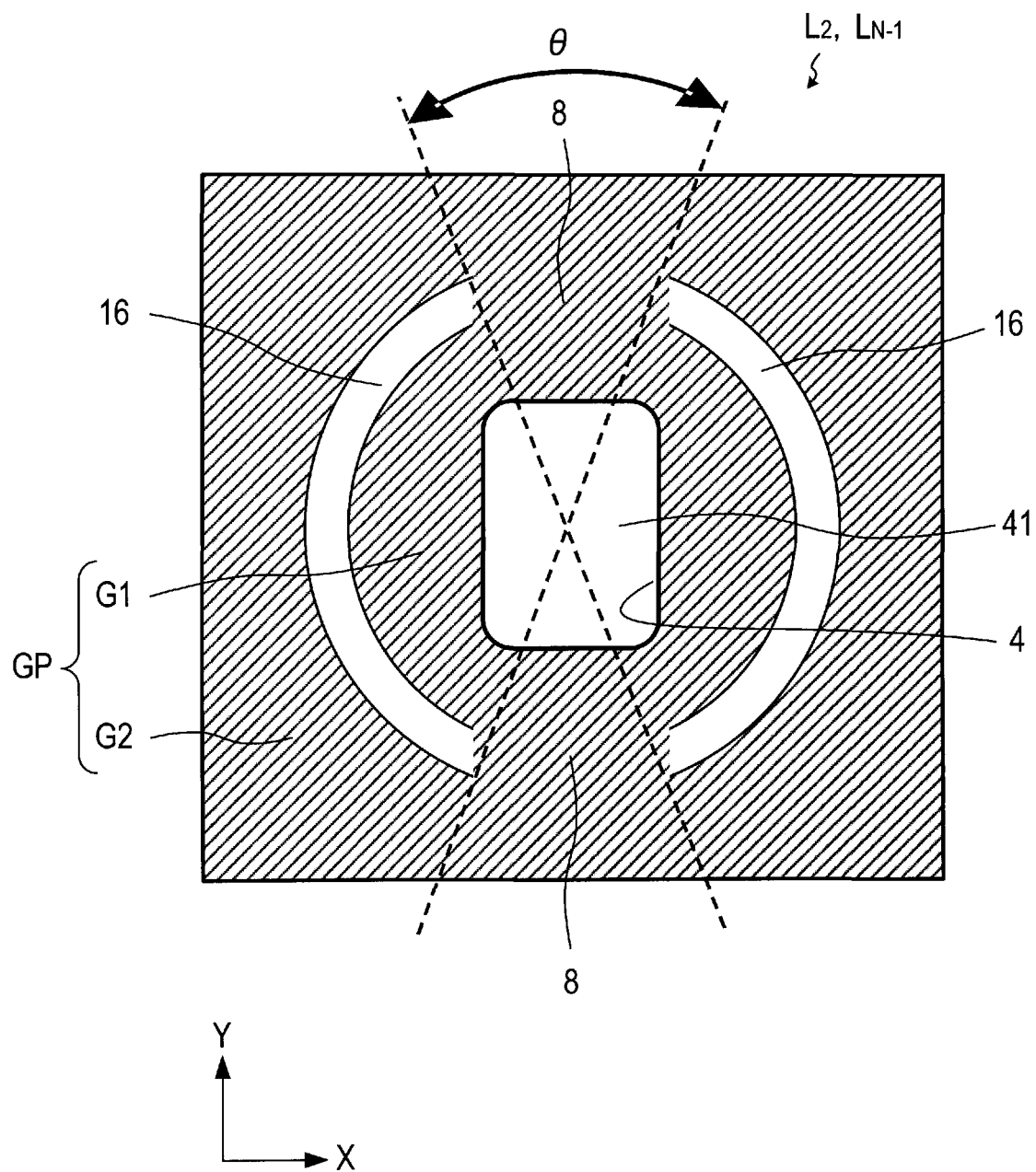
FIG. 5 is a pattern diagram illustrating the configuration of an interlayer line according to the second embodiment.

Specifically, as illustrated in FIG. 5, the ground pattern GP of each of the inner layers $L_2$ and $L_{N-1}$ has the two ring-shaped slits 16 formed therethrough. Each of the slits 16 is arranged to surround a corresponding portion of the waveguide 4. That is, the assembly of the two slits 16 has a substantially annular shape with two non-slit portions 8.

The slits 16 are each located to extend the predetermined angular range around the center of the waveguide 4 to form the two non-slit portions 8 between the slits 16. Each of the non-slit portions 8 has a predetermined angular range θ around the Y-axis direction passing through the center of the waveguide 4. The Y-axis direction passing through the center of the waveguide 4 shows a null azimuth in which leakage of electric field waves from the waveguide 4, which has a rectangular shape in its transverse cross section, is null.

The angular range θ around the Y-axis direction passing through the center of the waveguide 4, which defines each of the non-slit portions 8, is set to a range, such as ±30°, through which electric field waves leaked from the waveguide 4 are sufficiently small, such as ±30°. The angular range θ around the Y-axis direction passing through the center of the waveguide 4 can be freely determined.

2-2. Advantageous Effects

The second embodiment described in detail above achieves the following advantageous effects in addition to the advantageous effects achieved by the first embodiment.

The slits 16 of the second embodiment are each located to extend the predetermined angular range around the center of the waveguide 4 to leave the two non-slit portions 8 between the slits 16. This enables, if a plurality of waveguides 4 need be provided in the multilayer dielectric board 3 while being arranged in the Y-axis direction, the intervals between the adjacent waveguides 4 to be smaller as compared with a case where the plurality of waveguides 4 are arranged in the X-axis direction. This makes it possible to, if the plurality of waveguides 4 need be provided in the single multilayer dielectric board 3, improve the density of the waveguides 4 in the multilayer dielectric board 3.

The transmission line assembly of the second embodiment is configured such that leakage of electric field waves from the waveguide 4 propagated through each of the non-slit portions 8 is sufficiently small.

Although the transmission line assembly of the second embodiment includes the slits 16 that leave the non-slit portions 8 therebetween, this configuration maintains a smaller level of the transmission loss resulting from transmission of high frequency signals through the waveguide 4 between the first and second exterior circuits 10 mounted to the respective outer layers $L_1$ and $L_N$ of the transmission line assembly of the second embodiment. The smaller level of the transmission loss obtained by the transmission line assembly of the second embodiment is substantially the same as the smaller level of the transmission loss resulting from the transmission line assembly 1 of the first embodiment.

Third Embodiment 3-1. Different Points of Third Embodiment from First Embodiment A basic structure of a transmission line assembly of the third embodiment is identical to that of the transmission line assembly 1 of the first embodiment. The following therefore mainly describes the different points between the transmission line assembly of the third embodiment and the transmission line assembly 1 of the first embodiment. Reference characters assigned to respective elements in the first embodiment can be commonly assigned to respective elements in the third embodiment as long as each of the elements in the third embodiment has the same structure as the corresponding one of the elements in the first embodiment.

When describing each element in the third embodiment, which has the same structure as the corresponding element in the first embodiment, the following refers to the description of the corresponding element in the first embodiment.

A transmission line assembly 1a of the third embodiment includes a plurality of via holes 7 arranged along each slit 6, which is different from the transmission assembly 1 of the first embodiment.

Figure 6:
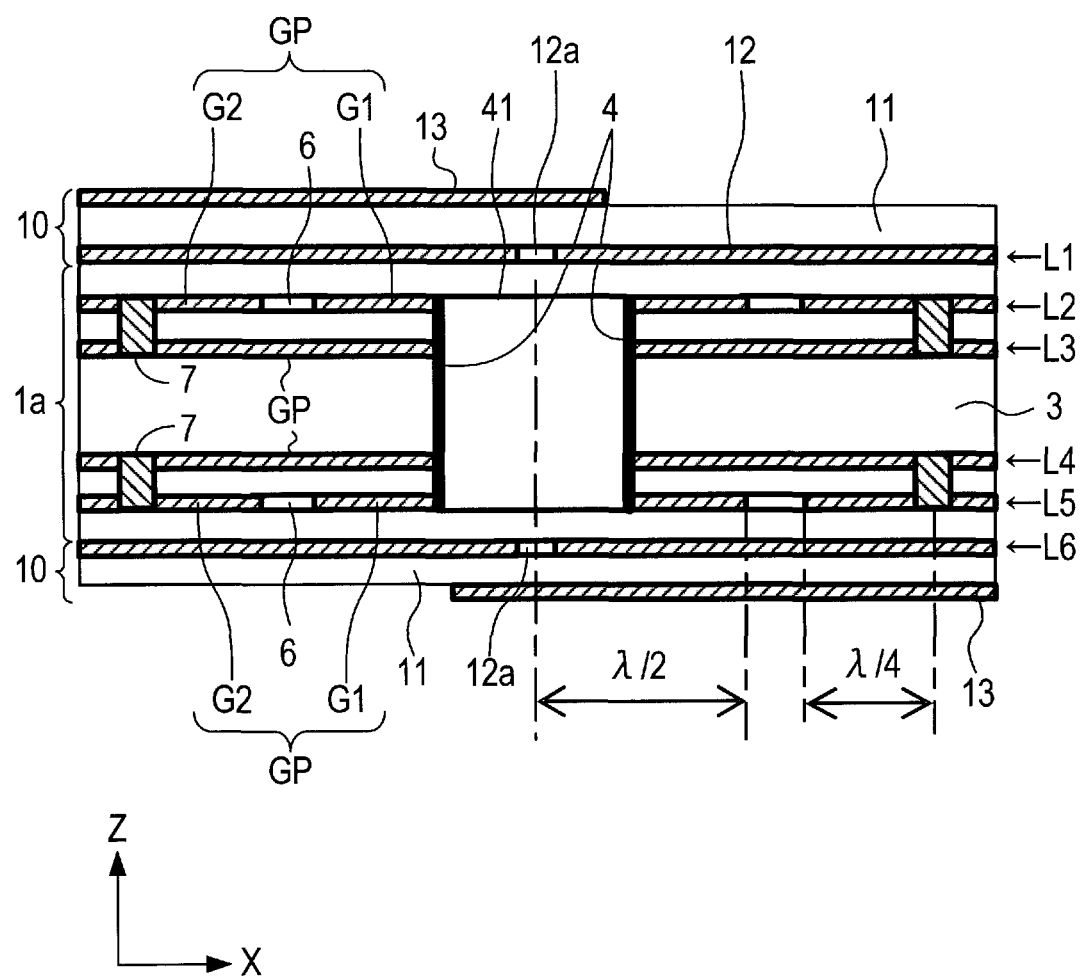
FIG. 6 is a cross sectional view illustrating the configuration of a transmission line assembly according to the third embodiment.
Figure 7:
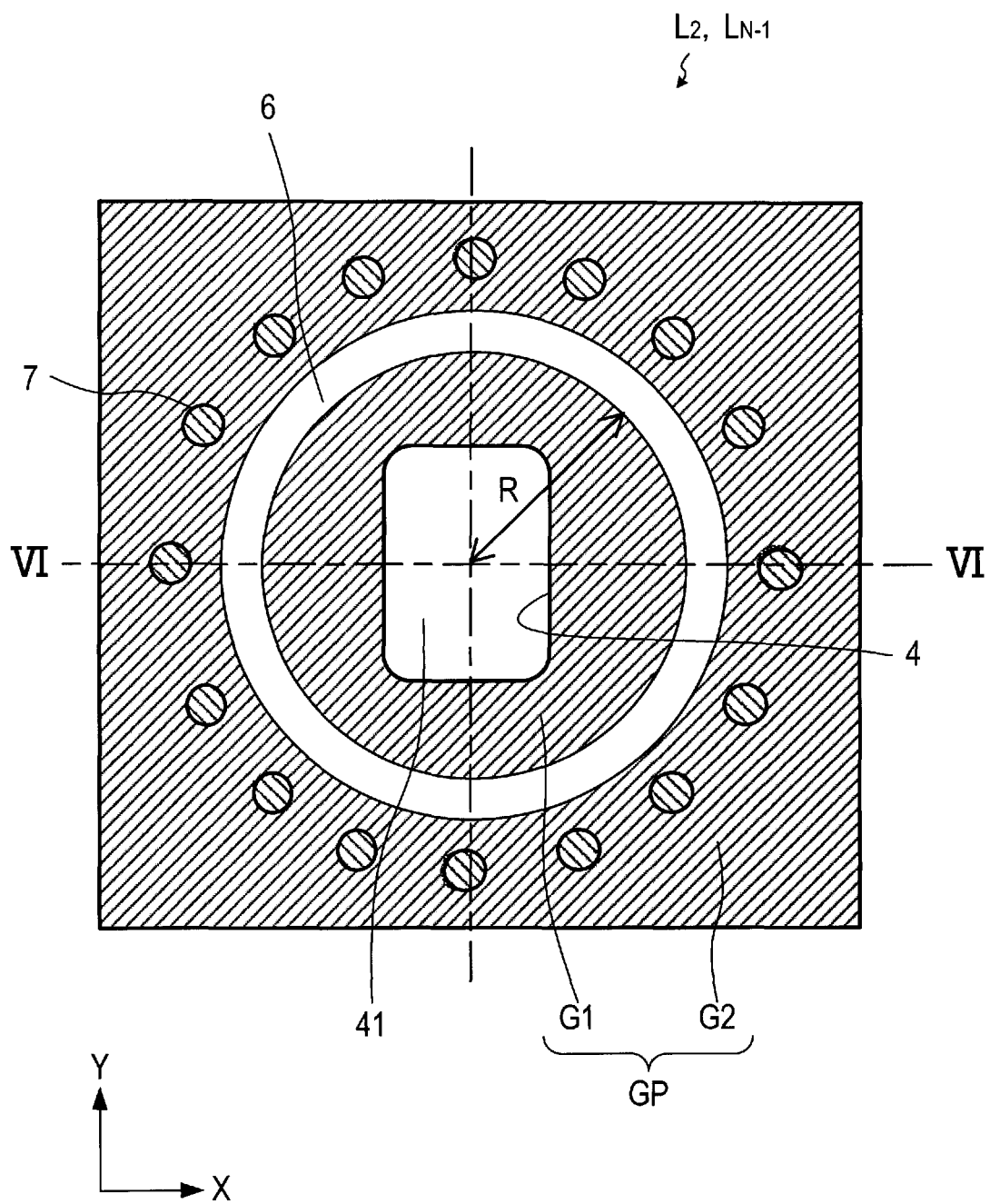
FIG. 7 is a pattern diagram illustrating the configuration of an interlayer line according to the third embodiment.

Specifically, referring to FIGS. 6 and 7, the transmission line assembly 1a includes (1) A first group of the via holes 7, arranged along the slit 6 of the inner layer $L_2$, which will also be referred to as a first slit 6, that electrically connect between the ground pattern GP of the inner layer $L_2$ and the ground pattern GP of the inner layer $L_3$ (2) A second group of the via holes 7, arranged along the slit 6 of the inner layer $L_{N-1}$, which will also be referred to as a second slit 6, that electrically connect between the ground pattern GP of the inner layer $L_{N-2}$ and the ground pattern GP of the inner layer $L_{N-1}$ Each of the via holes 7 serves as a feed-through conductor. Each feed-through conductor can have another configuration different from a via hole, which enables different pattern layers to be electrically conductive to each other.

Each via hole 7 of the first group is located in the outer ground pattern G2 of the inner layer $L_2$ at a minimum distance of $\lambda/4$ from the boundary of the outer ground pattern G2 with the first slit 6. Similarly, each via hole 7 of the second group is located in the outer ground pattern G2 of the inner layer $L_{N-1}$ at a minimum distance of $\lambda/4$ from the boundary of the outer ground pattern G2 with the second slit 6.

Additionally, the via holes 7 of each of the first and second groups are arranged at regular pitches that are for example set to be shorter than $\lambda/2$.

3-2. How Transmission Line Assembly Works

The slit 6 of each of the inner layers $L_2$ and $L_{N-1}$ achieves the maximum effect of reducing leakage of high frequency signals when the inner radius R of the slit 6 is set to $\lambda/2$. If, however, the inner radius R of the slit 6 deviates from $\lambda/2$ due to, for example, manufacture variation, it may be difficult to sufficiently cancel out high frequency signals propagated along the inner ground pattern G1, resulting in an increase of leakage of high frequency signals from the waveguide 4.

Figure 8:
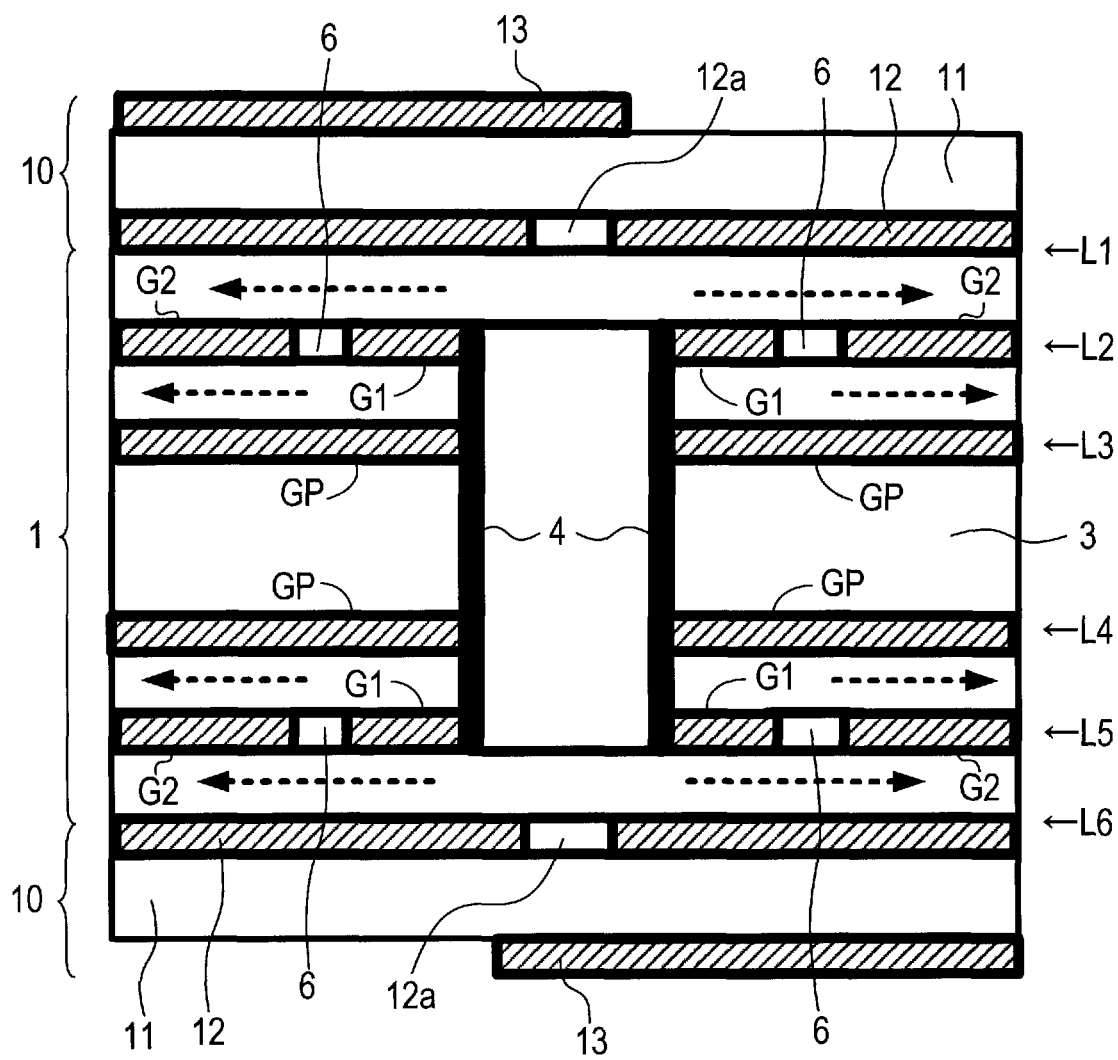
FIG. 8 is a cross sectional view illustrating the impact of deviating slits.

That is, if the inner radius R of the first slit 6 of the inner layer $L_2$ deviates from $\lambda/2$, high frequency signals may be propagated over the first slit 6 of the inner layer $L_2$ (see FIG. 8), so that the high frequency signals may enter into the dielectric layer between the inner layers $L_2$ and $L_3$ over the first slit 6 in addition to the dielectric layer between the first pair of specific layers $L_1$ and $L_2$, resulting in leakage of the high frequency signals from the dielectric layer between the inner layers $L_2$ and $L_3$; the dielectric layer between the inner layers $L_2$ and $L_3$ will be referred to as a first specific adjacent layer.

Similarly, if the inner radius R of the second slit 6 of the inner layer $L_{N-1}$ deviates from $\lambda/2$, high frequency signals may be propagated over the second slit 6 of the inner layer $L_{N-1}$ (see FIG. 8), so that the high frequency signals may enter into the dielectric layer between the inner layers L N−1 and $L_{N-2}$ in addition to the dielectric layer between the second pair of specific layers $L_{N-1}$ and $L_N$, resulting in leakage of the high frequency signals from the dielectric layer between the inner layers $L_{N-1}$ and $L_{N-2}$; the dielectric layer between the inner layers $L_{N-1}$ and $L_{N-2}$ will be referred to as a second specific adjacent layer.

Figure 9:
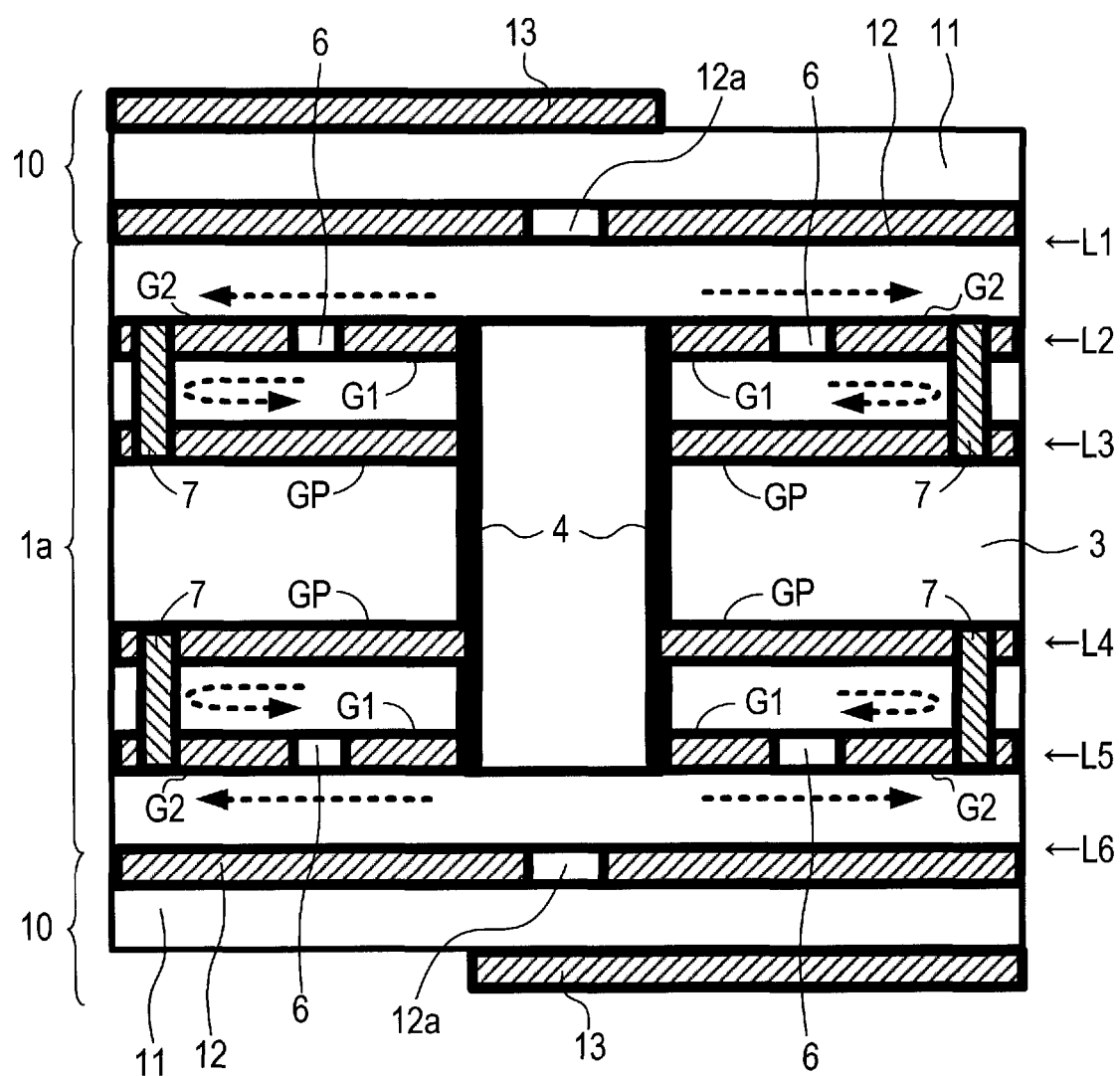
FIG. 9 is a cross sectional view illustrating how via holes work.

In contrast, the transmission line assembly 1a of the third embodiment includes (1) The first group via holes 7 provided to block the first specific adjacent layer between the inner layers $L_2$ and $L_3$ (2) The second group via holes 7 provided to block the second specific adjacent layer between the inner layers $L_{N-1}$ and $L_{N-2}$ This configuration of the transmission line assembly 1a enables, as illustrated in FIG. 9, high frequency signals propagated through the first specific adjacent layer to be reflected by the first group of the via holes 7 as third echo signals. Because the minimum distance of each via hole 7 of the first group from the first slit 6 of the inner layer $L_2$ is set to $\lambda/4$, the phase of the third echo signals reflected by the first group of the via holes 7 is opposite to the phase of leakage high frequency signals propagated at the first slit 6 of the inner layer $L_2$, resulting in the third echo signals cancelling out the leakage high frequency signals. That is, the first specific adjacent layer serves as a first choke structure.

Similarly, this configuration of the transmission line assembly 1a enables, as illustrated in FIG. 9, high frequency signals propagated through the second specific adjacent layer to be reflected by the second group of the via holes 7 as fourth echo signals. Because the minimum distance of each via hole 7 of the second group from the second slit 6 of the inner layer $L_{N-1}$ is set to $\lambda/4$, the phase of the fourth echo signals reflected by the second group of the via holes 7 is opposite to the phase of leakage high frequency signals propagated at the second slit 6 of the inner layer $L_{N-1}$, resulting in the fourth echo signals cancelling out the leakage high frequency signals. That is, the second specific adjacent layer also serves as a second choke structure.

3-3. Advantageous Effects

The third embodiment described in detail above achieves the following advantageous effects in addition to the advantageous effects achieved by the first embodiment.

A portion of the first specific adjacent layer located between each via hole 7 of the first group and the first slit 6 serves as a first choke structure, and a portion of the second specific adjacent layer located between each via hole 7 of the second group and the second slit 6 serves as a second choke structure. This enables, even if the inner radius R of each slit 6 deviates from $\lambda/2$, leakage of high frequency signals created due to the deviation to be reduced. This enables relaxing of the dimensional accuracy of manufacturing the transmission line assembly 1a while maintaining a sufficient effect of reducing leakage of high frequency signals, making it possible to more simply manufacture the transmission line assembly 1a with a lower cost.

Figure 10:
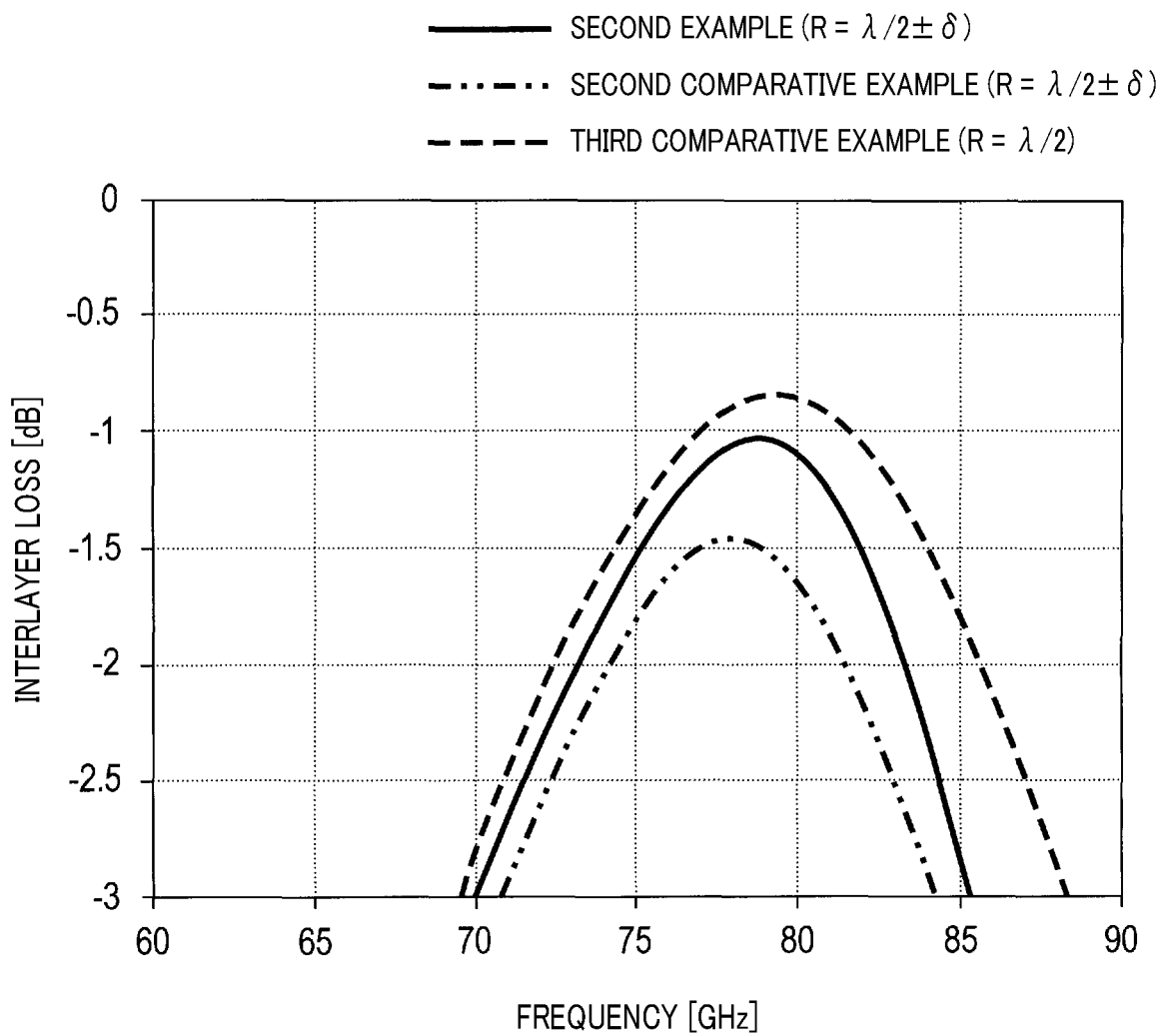
FIG. 10 is a graph illustrating (i) a first result of a transmission loss curve of an interlayer line calculated by a simulation according to a second example with via holes and positional deviations of slits, (ii) a second result of a transmission loss curve of an interlayer line calculated by a simulation according to a second comparative example that does not have via holes but has positional deviations of slits, and (iii) a third result of a transmission loss curve of an interlayer line calculated by a simulation according to a third comparative example that does not have positional deviations of slits.

FIG. 10 schematically illustrates (1) A first result of a transmission loss curve calculated by simulation when high frequency signals are transmitted through the waveguide 4 between the first and second exterior circuits 10 mounted to the respective outer layers $L_1$ and $L_N$ of a transmission line assembly 1 of a second example (2) A second result of a transmission loss curve calculated by simulation when high frequency signals are transmitted through the waveguide 4 between the first and second exterior circuits 10 mounted to the respective outer layers $L_1$ and $L_N$ of a transmission line assembly of a second comparative example (3) A third result of a transmission loss curve calculated by simulation when high frequency signals are transmitted through the waveguide 4 between the first and second exterior circuits 10 mounted to the respective outer layers $L_1$ and $L_N$ of a transmission line assembly of a third comparative example The transmission line assembly of the second example corresponds to the transmission line assembly 1a of the third embodiment, which includes the via holes 7 with the inner diameter R of each slit 6 deviating from $\lambda/2$.

Although the configuration of the transmission line assembly of the second comparison example is substantially identical to the configuration of the transmission line assembly 1 of the first embodiment without via holes 7, but the inner diameter R of each slit 6 deviates from $\lambda/2$.

The transmission line assembly of the third example corresponds to the transmission line assembly 1 or 1a with the inner diameter R of each slit 6 being accurately agreeing with $\lambda/2$.

FIG. 10 demonstrates that the via holes 7 of the transmission line assembly of the second example reduces leakage of high frequency signals due to deviation of the inner diameter R of each slit 6 from $\lambda/2$.

3-4. Modification of Third Embodiment

Figure 11:
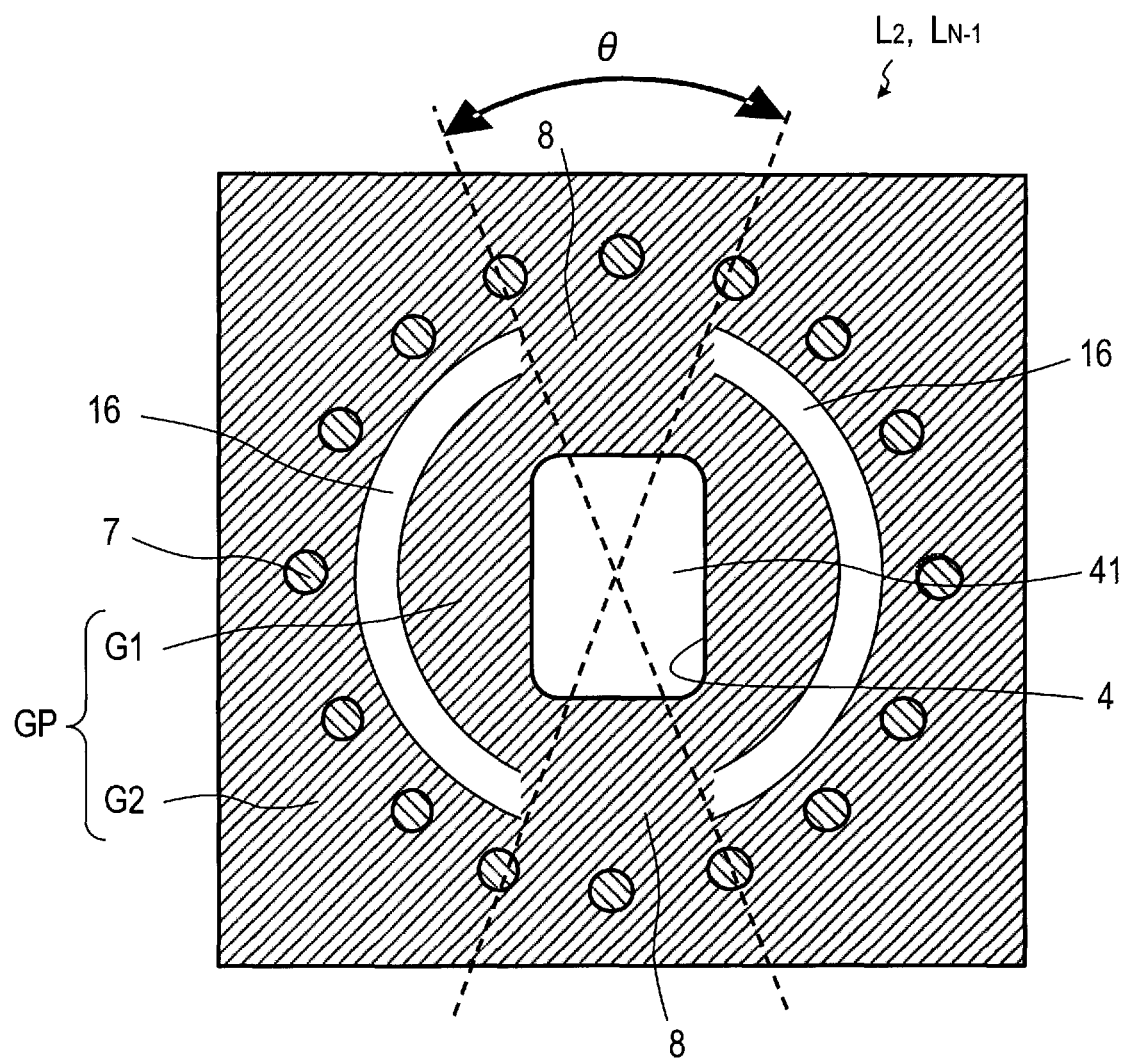
FIG. 11 is a pattern diagram illustrating the configuration of an interlayer line according to a modification of the third embodiment.

Referring to FIG. 11, the transmission line assembly 1a of the third embodiment can be configured such that slits 16 are provided through the ground pattern GP except the non-slit portions 8 (see FIG. 11).

As described above, the transmission line assembly 1a of the third embodiment is configured such that the first group of the via holes that electrically connect between the ground pattern GP of the inner layer $L_2$ and the ground pattern GP of the inner layer $L_3$ is separately provided from the second group of the via holes 7 that electrically connect between the ground pattern GP of the inner layer $L_{N-2}$ and the ground pattern GP of the inner layer $L_{N-1}$.

Figure 12:
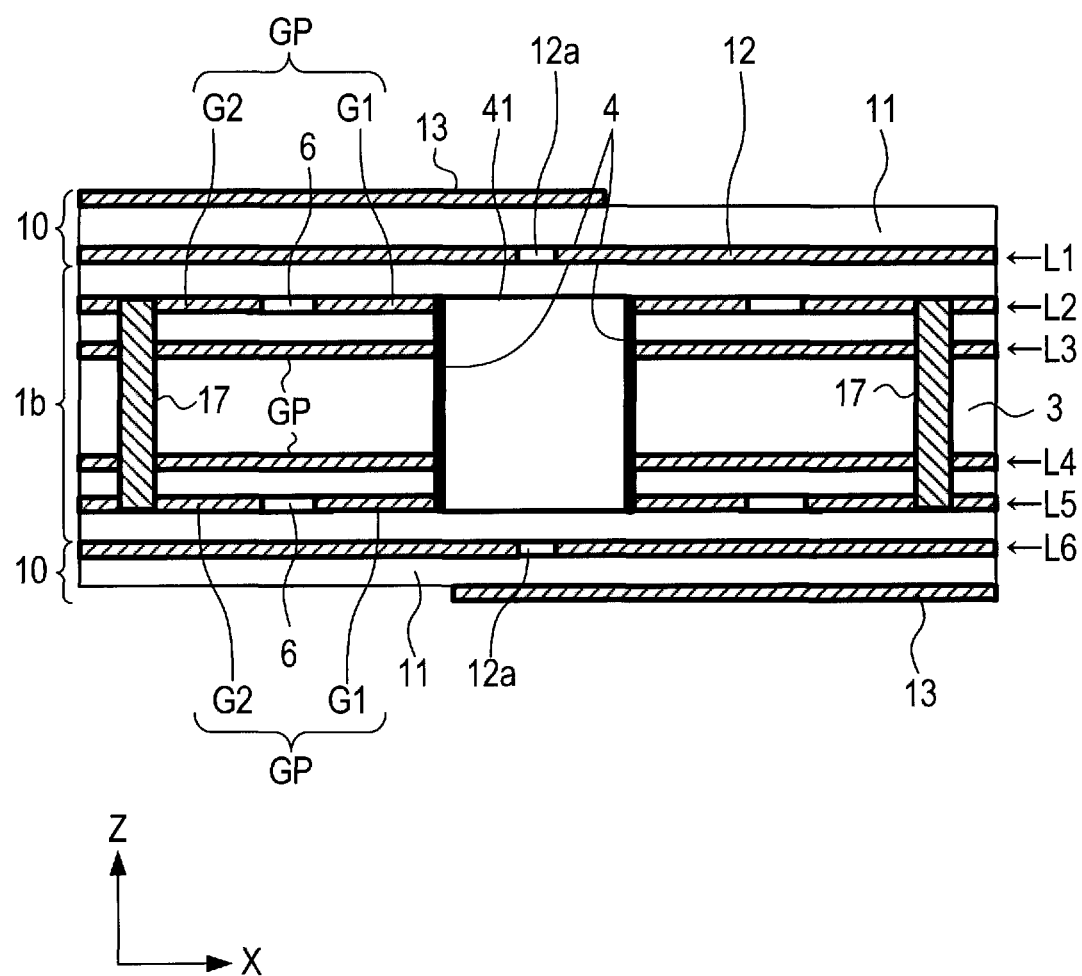
FIG. 12 is cross sectional view illustrating the configuration of each via hole according to another modification of the third embodiment.

In contrast, a transmission line assembly 1b according to another modification of the third embodiment can be configured such that via holes 17 electrically connect between all the ground patterns GPs of the inner layers $L_2$ to $L_{N-1}$ (see FIG. 12).

This configuration achieves the advantageous effects obtained by the second embodiment in addition to the advantageous effects obtained by each of the first and third embodiments.

4. Modifications

The first to third embodiments of the present disclosure have been described. The present disclosure is not limited to the above embodiments, and therefore can be variously modified.

Each of the first to third embodiments uses the waveguide 4 as an interlayer line, but the present disclosure is not limited thereto. Specifically, the present disclosure can use a pseudo waveguide member comprised of a waveguide and one or more via holes arranged to surround the waveguide, or use a coaxial line.

Each slit 6 according to the first and third embodiments has a ring shape around the center of the waveguide 4, but the present disclosure is not limited thereto.

Specifically, each slit 6, which has the inner edge facing the waveguide 4, can be configured such that the whole of the inner edge, i.e., inner boundary, of the corresponding slit 6 is concavely curved toward the waveguide 4, and any point on the concavely curved inner edge of each slit 6 has a minimum distance from the center of the waveguide 4; the minimum distance of any point on the concavely curved inner edge of each slit 6 is set to be within a predetermined range between $\lambda/2$ and a predetermined value inclusive. This configuration of each slit 6 prevents the minimum distance from the center of the waveguide 4 to any point on the inner edge of the corresponding slit 6 from being greatly changed depending on an orientation of the corresponding point from the center of the waveguide 4. This therefore prevents deterioration of the advantageous effect of reducing leakage of high frequency signals due to difference in phase between the high frequency signals at the inner edge of each slit 6.

Each of the first to third embodiments is configured such that the first opening end of the waveguide 4 is located in the ground pattern GP of the second layer $L_2$, which is selected as a first target layer, and the second opening end of the waveguide 4 is located in the ground pattern GP of the (N−1)-th layer $L_{N-1}$, which is selected as a second target layer. The present disclosure is not limited to this configuration.

Specifically, the present disclosure can be configured such that the first opening end of the waveguide 4 is located in the ground pattern GP of a selected one of the inner layers $L_2$ to $L_{N-1}$ as the first target layer, and the second opening end of the waveguide 4 is located in the ground pattern GP of a selected another one of the inner layers $L_2$ to $L_{N-1}$ as the second target layer. In this modification, the slits 6 are formed through the ground patterns GP of the respective first and second target inner layers.

The functions of one element in each embodiment can be distributed as plural elements, and the function of one element can be implemented by plural elements. The functions that plural elements have can be implemented by one element, and the function implemented by plural elements can be implemented by one element. At least part of the structure of each embodiment can be eliminated. At least part of each embodiment can be added to the structure of another embodiment, or can be replaced with a corresponding part of another embodiment.

The present disclosure can be implemented by various embodiments in addition to the transmission line assemblies 1 and 1a; the various embodiments include systems each include the transmission line assembly 1 or 1a, and methods of reducing signal leakage from a transmission line assembly.

What is claimed is:

1. A transmission line assembly comprising:
   a multilayer board comprising:
      a plurality of dielectric layers; and
      N pattern layers, N being an integer equal to or greater than 4, each adjacent pair of the N pattern layers being arranged to sandwich a corresponding one of the dielectric layers,
   the N pattern layers including:
      a first pattern layer as a first outer layer;
      an N-th pattern layer as a second outer layer, the first and second outer layers constituting respective outermost layers of the N pattern layers; and second to (N−1)-th pattern layers, each of the second to (N−1)-th pattern layers being sandwiched by a corresponding adjacent pair of the dielectric layers;

an interlayer line that enables a high frequency signal to be transmitted therethrough in a layering direction of the N pattern layers of the multilayer board, the interlayer line having first and second opening ends;

a first exterior circuit module mounted on the first outer layer;

a second exterior circuit module mounted on the second outer layer, each of the first and second exterior circuit modules being arranged such that the high frequency signal transmitted through the interlayer line is inputted thereto or outputted therefrom;

ground patterns mounted on the respective second to (N−1)-th pattern layers, each of the ground patterns being located to surround the interlayer line, the first opening end of the interlayer line being located in the ground pattern of a first target inner layer, the second opening end of the interlayer line being located in the ground pattern of a second target inner layer, the first target inner layer being one of the second to (N−1)-th pattern layers selected therefrom, the second target inner layer being another one of the second to (N−1)-th pattern layers selected therefrom, the second to (N−1)-th pattern layers except for the first and second target inner layers being referred to as inner layers; and first and second slits, each of the first and second slits having a band-like shape and being formed through the ground pattern of a corresponding one of the first and second target inner layers to expose a part of one of the dielectric layers, the one of the dielectric layers being adjacent to the corresponding one of the first and second target inner layers, each of the first and second slits having an edge facing the interlayer line, the edge of each of the first and second slits being concavely curved toward the interlayer line.

2. The transmission line assembly according to claim 1, further comprising:

a first group of feed-through conductors located across the first slit from the interlayer line, the first group of feed-through conductors electrically connecting between the ground pattern of the first target inner layer and at least the ground pattern of a selected one of the inner layers; and a second group of feed-through conductors located across the second slit from the interlayer line, the second group of feed-through conductors electrically connecting between the ground pattern of the second target inner layer and at least the ground pattern of a selected another one of the inner layers.

3. The transmission line assembly according to claim 2, wherein:

the feed-through conductors of the first group are located to surround the interlayer line, each of the feed-through conductors of the first group being separated from the first slit by a minimum distance of $\lambda/4$ where $\lambda$ represents an electrical length of the high frequency signal to be transmitted through the interlayer line; and the feed-through conductors of the second group are located to surround the interlayer line, each of the feed-through conductors of the second group being separated from the second slit by the minimum distance of $\lambda/4$.

4. The transmission line assembly according to claim 1, wherein:

each of the first and second slits is arranged to extend along a circle centered at a center of the interlayer line.

5. The transmission line assembly according to claim 4, wherein:

each of the first and second slits is located at a minimum distance of $\lambda/2$ from the center of the interlayer line.

6. The transmission line assembly according to claim 1, wherein:

the interlayer is a waveguide having a predetermined cross-sectional shape, the cross-sectional shape of the waveguide having at least one null azimuth in which leakage of an electric field is null; and each of the first and second slits is arranged around the center of the interlayer line except for a predetermined angular range around the at least one null azimuth.

7. The transmission line assembly according to claim 6, wherein:

the predetermined cross-sectional shape of the interlayer line is a rectangular cross-sectional shape; and the at least one null azimuth corresponds to a direction parallel to a longitudinal direction of the rectangular cross-sectional shape of the interlayer line.

* * * * *